United States Patent
You et al.

(10) Patent No.: US 12,501,794 B2
(45) Date of Patent: Dec. 16, 2025

(54) LIGHT EMITTING DISPLAY DEVICE

(71) Applicant: Samsung Display Co., LTD., Yongin-si (KR)

(72) Inventors: Chun Gi You, Yongin-si (KR); Hyoung Hak Kim, Yongin-si (KR); Hyun Young Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 348 days.

(21) Appl. No.: 18/098,465

(22) Filed: Jan. 18, 2023

(65) Prior Publication Data

US 2023/0354658 A1 Nov. 2, 2023

(30) Foreign Application Priority Data

Apr. 29, 2022 (KR) .......... 10-2022-0053639

(51) Int. Cl.
| | |
|---|---|
| *H10K 59/131* | (2023.01) |
| *H10K 59/121* | (2023.01) |
| *H10K 59/122* | (2023.01) |
| *H10K 71/00* | (2023.01) |

(52) U.S. Cl.
CPC ....... *H10K 59/131* (2023.02); *H10K 59/1213* (2023.02); *H10K 59/1216* (2023.02); *H10K 59/122* (2023.02); *H10K 71/861* (2023.02)

(58) Field of Classification Search
CPC .............. H10K 59/131; H10K 59/122; H10K 59/1213; H10K 59/1216; H10K 71/861
See application file for complete search history.

(56) References Cited

U.S. PATENT DOCUMENTS

| | | | |
|---|---|---|---|
| 2020/0083312 A1 | 3/2020 | Kim et al. | |
| 2021/0183983 A1* | 6/2021 | Bang | H10K 59/121 |
| 2022/0190096 A1* | 6/2022 | Park | H10K 59/131 |
| 2022/0199746 A1* | 6/2022 | Kim | H10K 50/865 |

FOREIGN PATENT DOCUMENTS

| | | |
|---|---|---|
| JP | 2010-281972 | 12/2010 |
| KR | 10-0382456 | 5/2003 |
| KR | 10-1156447 | 6/2012 |
| KR | 10-2014-0137272 A | 12/2014 |
| KR | 10-1993334 | 6/2019 |
| KR | 10-2020-0029226 A | 3/2020 |
| KR | 10-2294591 | 8/2021 |

* cited by examiner

*Primary Examiner* — Christine A Enad
(74) *Attorney, Agent, or Firm* — F. CHAU & ASSOCIATES, LLC

(57) ABSTRACT

An embodiment provides a light emitting display device including a pixel circuit disposed on a substrate, a repair line disposed on the substrate, a connection electrode overlapping the repair line in a thickness direction of the substrate, an insulating layer disposed on the pixel circuit and the connection electrode, a pixel electrode disposed on the insulating layer, and a connection portion disposed on the insulating layer. The pixel electrode includes a first electrode portion electrically connected to the pixel circuit through a first contact hole formed in the insulating layer and a second electrode portion electrically connected to the connection electrode through a second contact hole formed in the insulating layer. The connection portion electrically connect the first electrode portion and the second electrode portion.

20 Claims, 20 Drawing Sheets

LIGHT EMITTING DISPLAY DEVICE

CROSS-REFERENCE TO RELATED APPLICATION(S)

This application claims priority to and the benefits of Korean Patent Application No. 10-2022-0053639 under 35 U.S.C. § 119, filed on Apr. 29, 2022, in the Korean Intellectual Property Office (KIPO), the entire contents of which are incorporated herein by reference.

BACKGROUND

1. Technical Field

This disclosure relates to a light emitting display device including light emitting diodes.

2. Description of the Related Art

A light emitting display device includes light emitting elements corresponding to pixels and may display an image by controlling brightness of each of the light emitting elements. Unlike a light-receiving display device such as a liquid crystal display, the light emitting display device does not require a separate light source such as a backlight, and thus a thickness and weight thereof may be reduced. In addition, the light emitting display device has characteristics such as high luminance, a high contrast ratio, high color reproduction, and a high response speed, so that a high-quality image may be displayed.

Due to these advantages, the light emitting display device is being applied to various electronic devices, such as a mobile device such as a smart phone, a tablet, and a laptop computer, a monitor, and a television, and is being highlighted as a display device for a vehicle.

The above information disclosed in this Background section is only for enhancement of understanding of the background, and therefore it may contain information that does not form the prior art that is already known in this country to a person of ordinary skill in the art.

SUMMARY

Embodiments are to provide a light emitting display device of which a defective pixel may be repaired.

An embodiment provides a light emitting display device that may include a pixel circuit disposed on a substrate; a repair line disposed on the substrate, a connection electrode overlapping the repair line in a thickness direction of the substrate, an insulating layer disposed on the pixel circuit and the connection electrode, a pixel electrode disposed on the insulating layer, and a connection portion disposed on the insulating layer. The pixel electrode may include a first electrode portion electrically connected to the pixel circuit through a first contact hole formed in the insulating layer and a second electrode portion electrically connected to the connection electrode through a second contact hole formed in the insulating layer. The connection portion may electrically connect the first electrode portion and the second electrode portion.

A width of the connection electrode may be greater than a width of the repair line.

The light emitting display device may further include a pixel defining layer disposed on the insulating layer and including a first opening and a second opening respectively overlapping the first electrode portion and the second electrode portion in the thickness direction. The pixel defining layer may cover the connection portion.

The light emitting display device may further include a light emitting layer including a first portion and a second portion that are respectively disposed on the first electrode portion and the second electrode portion and are separated from each other.

The pixel circuit may include a transistor, and the first electrode portion may be electrically connected to an electrode of the transistor. The connection electrode and the electrode of the transistor may be formed of a same material in a same process.

The pixel circuit may include a capacitor. The repair line and an electrode of the capacitor may be formed of a same material in a same process.

The pixel electrode may have an opening passing through the pixel electrode in the thickness direction and disposed between the first electrode portion and the second electrode portion.

The light emitting display device may further include a dummy pixel circuit disposed on the substrate and electrically connected to the repair line. The substrate may include a display area displaying an image and a non-display area disposed adjacent to the display area. The pixel circuit may be disposed in the display area, and the dummy pixel circuit may be disposed in the non-display area.

The light emitting display device may further include a data line electrically connected to the pixel circuit and transmitting a data voltage, and a gate line electrically connected to the pixel circuit and transmitting a gate signal. The repair line and the data line may extend in a same direction, or the repair line and the gate line may extend in a same direction.

The connection portion may be disposed between the first and second electrode portions and the insulating layer.

The connection portion may include titanium.

The light emitting display device may further include a pad portion including a plurality of pads. Each of the plurality of pads may include a plurality of electrode layers, and an uppermost layer of the plurality of electrode layers and the connection portion may be formed of a same material in a same process.

The uppermost layer may completely cover an electrode layer of the plurality of electrode layers disposed immediately below the uppermost layer.

The light emitting display device may further include a light emitting layer including a first portion disposed on the first electrode portion, a second portion disposed on the second electrode portion, and a third portion disposed on the connection portion. The first portion, the second portion, and the third portion may be integral with each other.

A length of the connection portion may be greater than or equal to about 4.5 μm.

Another embodiment provides a light emitting display device that may include a pixel circuit and a dummy pixel circuit each disposed on a substrate, a repair line electrically connected to the dummy pixel circuit, a connection electrode overlapping the repair line in a thickness direction of the substrate and electrically connected to the repair line, a pixel electrode including a first electrode portion electrically connected to the pixel circuit and a second electrode portion electrically connected to the connection electrode, and a light emitting layer including a first portion disposed on the first electrode portion and a second portion disposed on the second electrode portion. The first electrode portion and the second electrode portion may be separated from each other.

The light emitting display device may further include a pixel defining layer disposed on the pixel electrode and including a first opening and a second opening respectively overlapping the first electrode portion and the second electrode portion in the thickness direction. The first opening and the second opening may be separated from each other.

The pixel circuit may include a capacitor. The repair line and an electrode of the capacitor may be formed of a same material in a same process.

The light emitting display device may further include an insulating layer disposed between the repair line and the connection electrode. The repair line may be laser-welded to the connection electrode through the insulating layer.

The light emitting display device may further include an insulating layer disposed between the connection electrode and the pixel electrode, and a conductive layer disposed between the insulating layer and the first and second electrode portions and contacting the insulating layer, the first electrode portion, and the second electrode portion.

According to the embodiments, it is possible to repair a defective pixel of a light emitting display device, and it is possible to prevent an entire defective pixel from being darkened. According to the embodiments, there is also an advantageous effect that may be recognized throughout the specification.

DETAILED DESCRIPTION OF THE EMBODIMENTS

This disclosure will be described more fully hereinafter with reference to the accompanying drawings.

It will be understood that when an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 1:
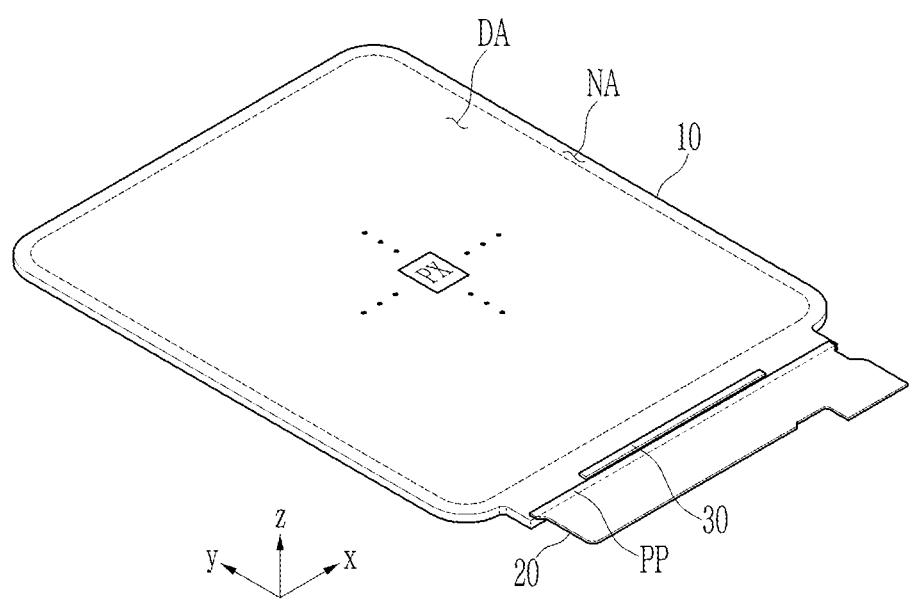
FIG. 1 illustrates a schematic perspective view of a light emitting display device according to an embodiment.

FIG. 1 illustrates a schematic perspective view of a light emitting display device according to an embodiment.

Referring to FIG. 1, a light emitting display device (hereinafter, simply referred to as a "display device") may include a display panel 10, a flexible printed circuit film 20 bonded to the display panel 10, and a driving device including an integrated circuit chip 30 and the like.

The display panel 10 may include a display area DA corresponding to a screen on which an image is displayed, and a non-display area NA in which circuits and/or signal lines for generating and/or transmitting various signals applied to the display area DA are disposed. The non-display area NA may be disposed adjacent to the display area DA.

In FIG. 1, inner and outer sides of a dotted line quadrangle may correspond to the display area DA and the non-display area NA, respectively.

In the display area DA of the display panel 10, pixels PX may be disposed in a matrix format. Signal lines such as a gate line, a data line, and a driving voltage line may be disposed in the display area DA. The gate line may substantially extend in a first direction (x), and the data line and the driving voltage line may substantially extend in a second direction (y). The gate line, the data line, the driving voltage line, and the like may be connected to each of the pixels PX, so that each of the pixels PX may receive a gate signal, a data voltage, a driving voltage, and the like from these signal lines. The pixel PX may be implemented as a light emitting element such as a light emitting diode.

A touch sensor for detecting a user's contact and/or non-contact touch may be disposed in the display area DA. Although a substantially quadrangular display area DA is illustrated in FIG. 1, the display area DA may have various shapes other than a quadrangular shape, such as a polygonal shape, a circular shape, an elliptical shape, and the like.

In the non-display area NA of the display panel 10, a pad portion PP in which pads for receiving signals from the outside of the display panel 10 are arranged may be positioned. The pad portion PP may extend in the first direction (x) along one edge of the display panel 10. The flexible printed circuit film 20 may be bonded to the pad portion PP, and pads of the flexible printed circuit film 20 may be electrically connected to pads of the pad portion PP.

A driving unit that generates and/or processes various signals for driving the display panel 10 may be positioned in the non-display area NA of the display panel 10. The driving unit may include a data driver for applying a data voltage to data lines, a gate driver for applying a gate signal to gate lines, and a signal controller for controlling the data driver and the gate driver. The pixels PX may receive a data voltage at predetermined (or selectable) timing according to a gate signal generated by the gate driver. The gate driver may be integrated on the display panel 10, and may be positioned on at least one side of the display area DA. The data driver and the signal controller may be provided as an integrated circuit chip (also referred to as a driving IC chip) 30, and the integrated circuit chip 30 may be mounted in the non-display area NA of the display panel 10. The integrated circuit chip 30 may be mounted on the flexible printed circuit film 20 to be electrically connected to the display panel 10.

Figure 2:
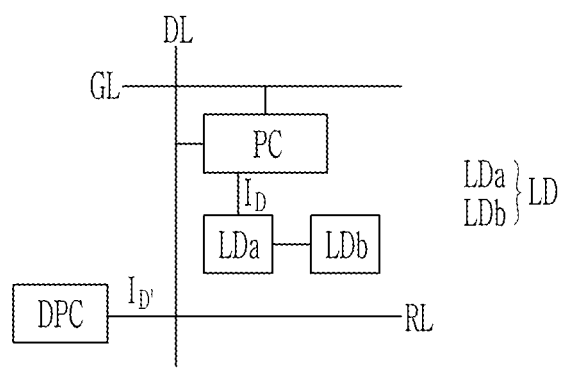
FIG. 2 illustrate a schematic view of a pixel according to an embodiment.
Figure 3:
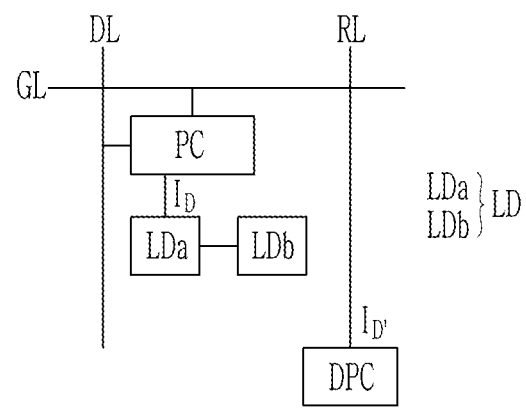
FIG. 3 illustrates a schematic view of a pixel according to an embodiment.

FIG. 2 and FIG. 3 respectively illustrate a schematic view of a pixel according to an embodiment.

Referring to FIG. 2 and FIG. 3, one pixel PX may include a pixel circuit PC and a light emitting element LD connected thereto. A gate line GL and a data line DL may be connected to the pixel circuit PC. The gate line GL may be connected to the gate driver, and may substantially extend in the first direction (x). The data line DL may be connected to the data driver, and may substantially extend in the second direction (y). The pixel circuit PC may generate a driving current $I_D$ based on signals applied through signal lines such as the gate line GL and the data line DL to apply it to the light emitting element LD.

The light emitting element LD may include a first light emitting portion LDa and a second light emitting portion LDb connected to each other. For example, one light emitting element LD may be divided into the first light emitting portion LDa and the second light emitting portion LDb. The first light emitting portion LDa may be connected to the pixel circuit PC, and the second light emitting portion LDb may be connected to the pixel circuit PC through the first light emitting portion LDa. The first light emitting portion LDa and the second light emitting portion LDb may be applied with a same driving current $I_D$.

A repair line RL may be positioned adjacent to the pixel PX. The repair line RL may be connected to a dummy pixel circuit DPC. The repair line RL may substantially extend in the first direction (x) as shown in FIG. 2 or may substantially extend in the second direction (y) as shown in FIG. 3. The dummy pixel circuit DPC may be positioned in the non-display area NA. For example, the dummy pixel circuit DPC may be positioned between the gate driver and the display area DA. The dummy pixel circuit DPC may receive a data voltage from the data driver to generate the driving current $I_{D'}$. As the dummy pixel circuit DPC is positioned in the non-display area NA, the repair line RL connected thereto may extend in the non-display area NA and the display area DA. The repair line RL may be connected to the second light emitting portion LDb in case that the first light emitting portion LDa is defective to apply the driving current $I_{D'}$ to the second light emitting portion LDb.

Figure 4:
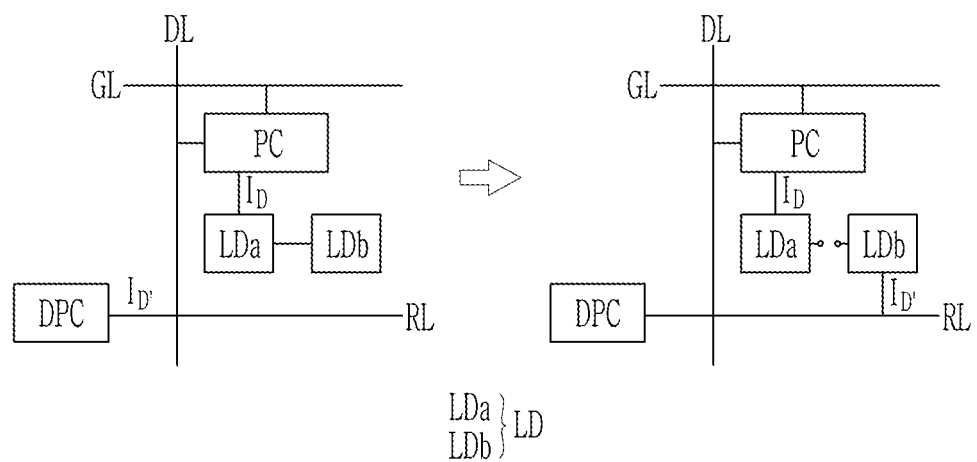
FIG. 4 illustrates a repair method of a defective pixel according to an embodiment.
Figure 5:
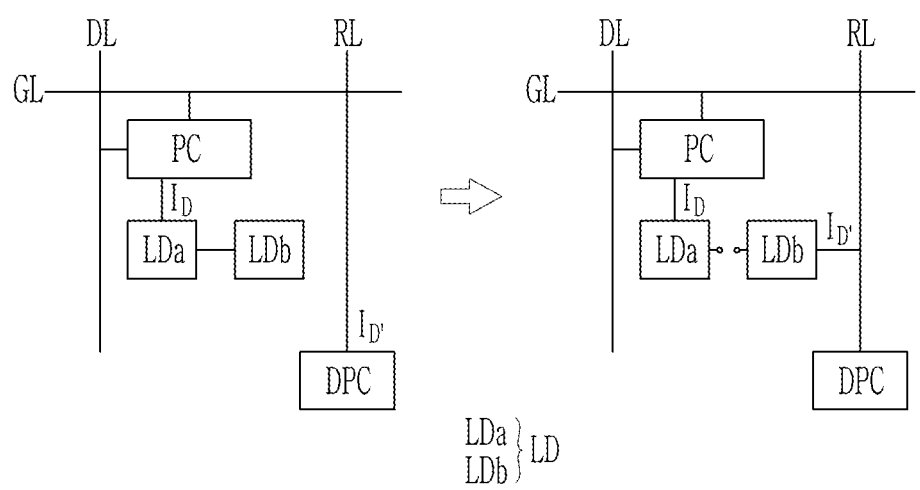
FIG. 5 illustrates a repair method of a defective pixel according to an embodiment

FIG. 4 and FIG. 5 illustrate a repair method of a defective pixel according to an embodiment.

Referring to FIG. 4 and FIG. 5, in case that a defect occurs in the first light emitting portion LDa, the second light emitting portion LDb connected to the first light emitting portion LDa may also not normally operate. In order to separate the second light emitting portion LDb from the first light emitting portion LDa, the second light emitting portion LDb may be disconnected from the first light emitting portion LDa. For example, a connection portion between the first light emitting portion LDa and the second light emitting portion LDb may be cut off. Since the second light emitting portion LDb may receive the driving current $I_D$ through the first light emitting portion LDa, in case that the second light emitting portion LDb is disconnected from the first light emitting portion LDa, the second light emitting portion LDb cannot receive the driving current $I_D$. Accordingly, the second light emitting portion LDb may be connected to the repair line RL, so that the driving current $I_{D'}$ from the dummy pixel circuit DPC may be applied to the second light emitting portion LDb through the repair line RL. Intensity of the driving current $I_{D'}$ from the dummy pixel circuit DPC may be the same as the intensity of the driving current $I_D$, or may be greater than the intensity of the driving current $I_D$. For example, in case that the first light emitting portion LDa is defective, even if the second light emitting portion LDb emits light, luminance of the pixel PX may be decreased because a light emitting area is decreased. In case that the larger driving current $I_D$ is applied to the second light emitting portion LDb, the second light emitting portion LDb may emit light more brightly, so that a decrease in luminance due to a defect in the first light emitting portion LDa may be compensated.

In case that the first light emitting portion LDa is defective, the connection between the pixel circuit PC and the first light emitting portion LDa may be maintained or disconnected. However, in case that a bright spot in the first light emitting portion LDa occurs due to a defect in the pixel circuit PC, the pixel circuit PC and the first light emitting portion LDa may be disconnected.

Even in case that a defect occurs in the second light emitting portion LDb, the second light emitting portion LDb may be disconnected from the first light emitting portion LDa. Since the first light emitting portion LDa is connected to the pixel circuit PC to receive the driving current $I_D$, there is no need to connect the repair line RL to the first light emitting portion LDa. For example, in case that the defect occurs in the second light emitting portion LDb, the first light emitting portion LDa may be normally operated by simply disconnecting the connection between the first light emitting portion LDa and the second light emitting portion LDb. The intensity of the driving current $I_D$ may be the same as that applied during a normal operation of the second light emitting portion LDb, or may be greater than that applied to compensate for a decrease in luminance due to a defect of the second light emitting portion LDb.

As described above, the light emitting element LD may be divided into the first light emitting portion LDa and the second light emitting portion LDb, and in case that a defect occurs in one of the light emitting portions LDa and LDb, by disconnecting the first light emitting portion LDa and the second light emitting portion LDb and normally operating the other thereof, it is possible to prevent the pixel PX from being displayed as a dark spot.

Figure 6:
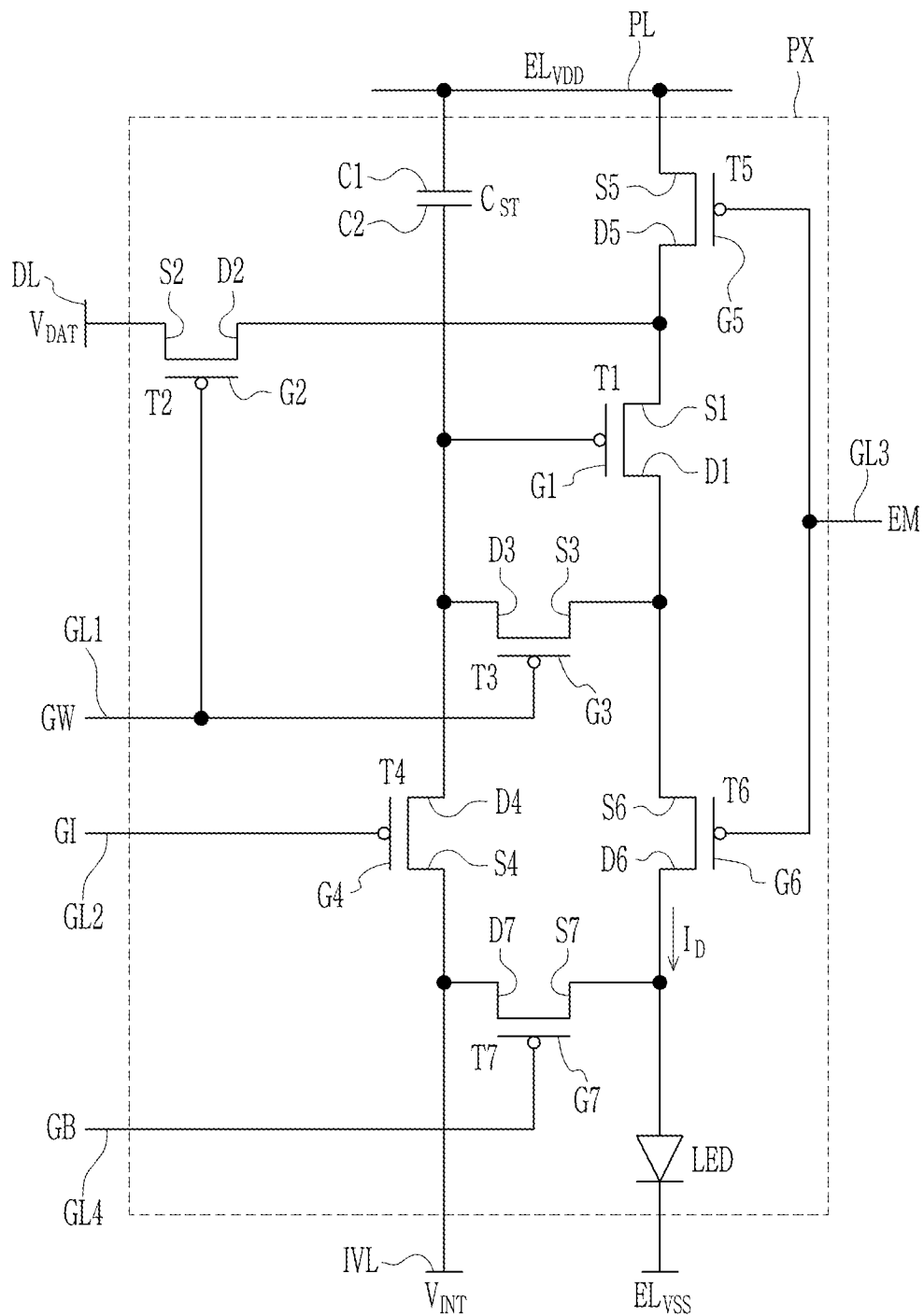
FIG. 6 illustrates a schematic diagram of an equivalent circuit of one pixel of a light emitting display device according to an embodiment.
Figure 7:
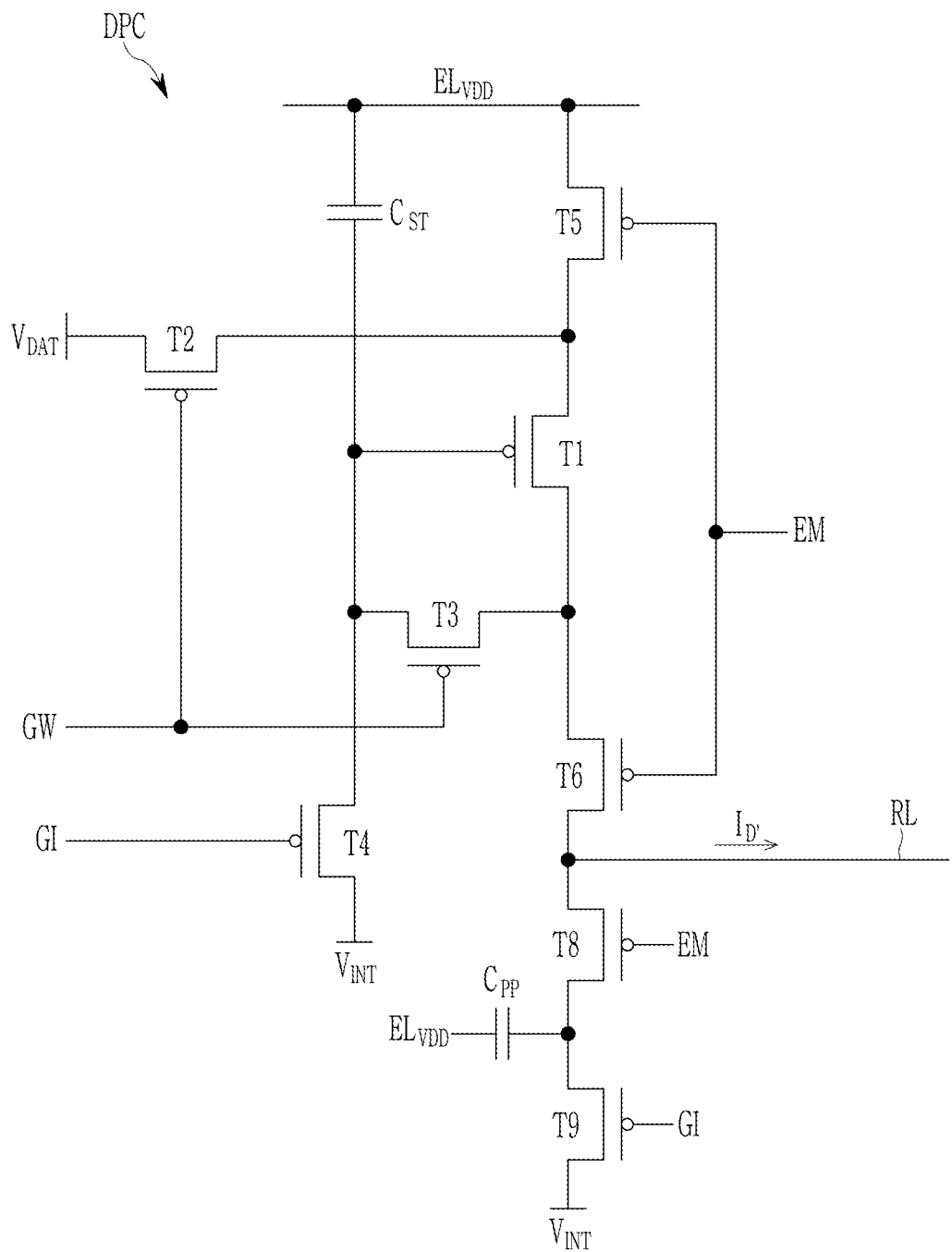
FIG. 7 illustrates a schematic diagram of an equivalent circuit of a dummy pixel circuit of a light emitting display device according to an embodiment.

FIG. 6 illustrates a schematic diagram of an equivalent circuit of one pixel of a light emitting display device according to an embodiment, and FIG. 7 illustrates a schematic diagram of an equivalent circuit of a dummy pixel circuit of a light emitting display device according to an embodiment.

Referring to FIG. 6, the pixel PX may include transistors T1 to T7, a storage capacitor $C_{ST}$, and a light emitting diode LED that are connected to signal lines GL1, GL2, GL3, GL4, DL, PL, and IVL. In the pixel PX illustrated in FIG. 6, the light emitting diode LED may configure the light emitting element LD, and components other than the light emitting element LD may configure the pixel circuit PC.

The transistors T1 to T7 may include a driving transistor T1, a switching transistor T2, a compensation transistor T3, an initialization transistor T4, an operation control transistor T5, a light emitting control transistor T6, and a bypass transistor T7.

The signal lines GL1, GL2, GL3, GL4, DL, PL, and IVL may include a scan line GL1, an initialization control line GL2, a light emitting control line GL3, a bypass control line GL4, a data line DL, a driving voltage line PL, and an initialization voltage line IVL. The wire schematically illustrated as the gate line GL in FIG. 2 to FIG. 5 may be divided into the scan line GL1, the initialization control line GL2, the light emitting control line GL3, and the bypass control line GL4.

The scan line GL1 may transmit a scan signal GW to the switching transistor T2 and the compensation transistor T3. The initialization control line GL2 may transmit an initialization control signal GI to the initialization transistor T4. The light emitting control line GL3 may transmit a light emitting control signal EM to the operation control transistor T5 and the light emitting control transistor T6. The bypass control line GL4 may transmit a bypass signal GB to the bypass transistor T7. The bypass control line GL4 may be connected to the initialization control line GL2.

The data line DL may receive a data voltage $V_{DAT}$, and the driving voltage line PL and the initialization voltage line IVL may receive a driving voltage $EL_{VDD}$ and an initialization voltage $V_{INT}$, respectively. The initialization voltage $V_{INT}$ may initialize the driving transistor T1.

Respective transistors T1 to T7 may include gate electrodes G1 to G7, first electrodes S1 to S7, and second electrodes D1 to D7, and the storage capacitor $C_{ST}$ may be a storage capacitor and may include a first electrode C1 and a second electrode C2. The electrodes of the transistors T1 to T7 and the storage capacitor $C_{ST}$ may be connected as shown in FIG. 6. An anode of the light emitting diode LED may be connected to the second electrode D1 of the driving transistor T1 through the light emitting control transistor T6, and may receive the driving current $I_D$. A cathode of the light emitting diode LED may receive a common voltage $EL_{VSS}$.

In the circuit structure of the pixel PX, the type of the transistors, the number of the transistors, the number of the capacitors, and the connection between them may be variously changed. For example, the compensation transistor T3, the initialization transistor T4, and/or the bypass transistor T7 may be N-type transistors.

The dummy pixel circuit DPC may have a configuration substantially the same as or similar to that of the pixel circuit PC. For example, referring to FIG. 7, the dummy pixel circuit DPC may include transistors T1 to T6 and storage capacitors $C_{ST}$ that are also included in the pixel circuit PC, and may include transistors T8 and T9 and a pumping capacitor Cpp. For example, compared to the pixel circuit PC, the dummy pixel circuit DPC may not include the bypass transistor T7, and may further include a first pumping transistor T8, a second pumping transistor T9, and the pumping capacitor Cpp. A repair line RL may be connected to a node to which the light emitting control transistor T6 and the first pumping transistor T8 are connected. The repair line RL may transmit the driving current $I_{D'}$ generated by the dummy pixel circuit DPC.

A gate electrode of the first pumping transistor T8 may receive the light emitting control signal EM. A first electrode of the first pumping transistor T8 may be connected to a second electrode of the light emitting control transistor T6, and a second electrode of the first pumping transistor T8 may be connected to a first electrode of the second pumping transistor T9. A gate electrode of the second pumping transistor T9 may receive the initialization control signal GI. A second electrode of the second pumping transistor T9 may receive the initialization voltage $V_{INT}$. A first electrode of the pumping capacitor Cpp may be connected to a node to which the first pumping transistor T8 and the second pumping transistor T9 are connected, and the driving voltage $EL_{VDD}$ may be applied to a second electrode of the pumping capacitor Cpp. In case that the first pumping transistor T8 is turned on by the light emitting control signal EM, the repair line RL and the pumping capacitor Cpp may be connected, and a parasitic capacitor of the repair line RL and the pumping capacitor Cpp may be connected in parallel, so that an amount of charge charged by the parasitic capacitor of the repair line RL may be reduced. Accordingly, image quality deterioration such as luminance change that may occur due to the parasitic capacitor of the repair line RL may be prevented. The second pumping transistor T9 may initialize the first electrode of the pumping capacitor Cpp to the initialization voltage $V_{INT}$ according to the initialization control signal GI. The dummy pixel circuit DPC may be variously changed to include a circuit structure capable of compensating for changes in electrical characteristics due to the repair line RL or the like.

Figure 8:
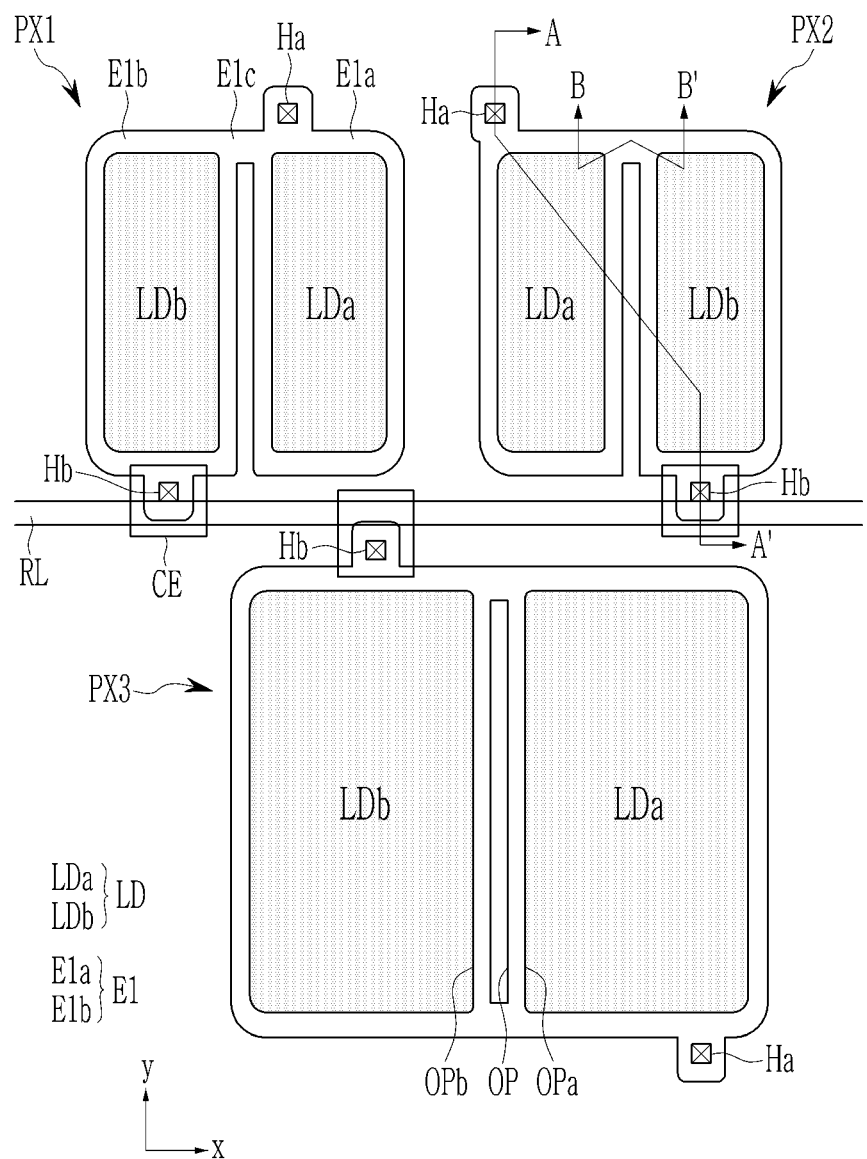
FIG. 8 illustrates a schematic top plan view of pixels disposed in a display area in a light emitting display device according to an embodiment.
Figure 9:
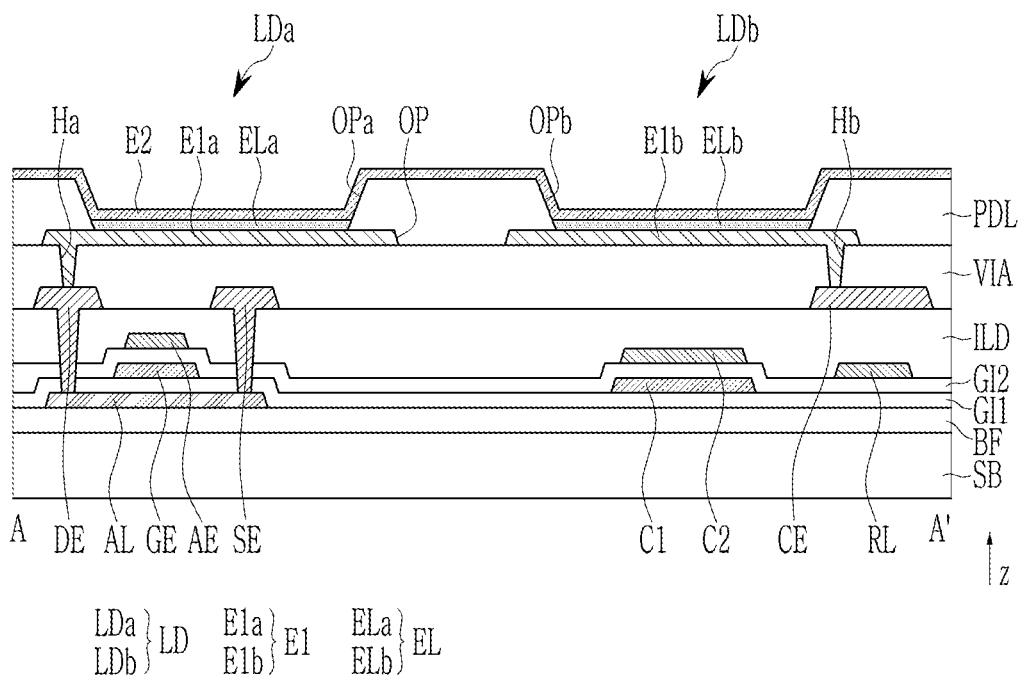
FIG. 9 illustrates a schematic cross-sectional view of an embodiment taken along line A-A' of FIG. 8.
Figure 10:
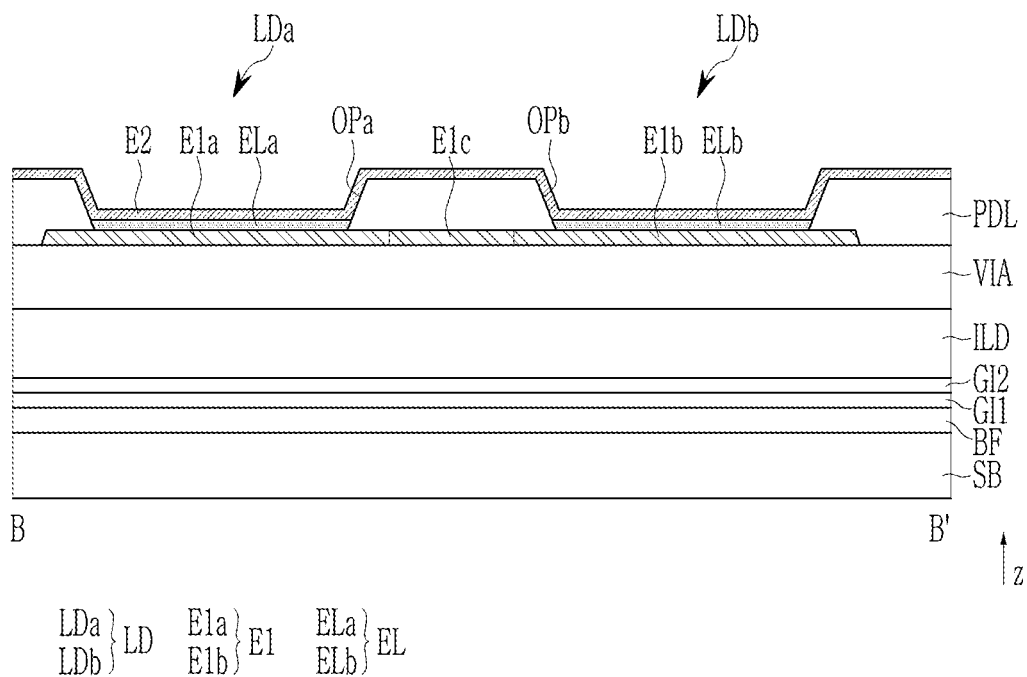
FIG. 10 illustrates a schematic cross-sectional view of an embodiment taken along line B-B' of FIG. 8.

FIG. 8 illustrates a schematic top plan view of pixels disposed in a display area in a light emitting display device according to an embodiment, FIG. 9 illustrates a schematic cross-sectional view of an embodiment taken along line A-A' of FIG. 8, and FIG. 10 illustrates a schematic cross-sectional view of an embodiment taken along line B-B' of FIG. 8. In order to simplify the drawings, components for showing the features of the embodiment in FIG. 7 are shown in FIGS. 8-10.

FIG. 8 illustrates pixels PX1, PX2, and PX3 disposed in the display area DA of the display panel 10. Although three pixels are shown, the pixels PX1, PX2, and PX3 may be regularly disposed in a matrix format in the display area DA.

The pixels PX1, PX2, and PX3 may include a first pixel PX1, a second pixel PX2, and a third pixel PX3. The first pixel PX1, the second pixel PX2, and the third pixel PX3 may display different colors, and each of them may display one of the primary colors. For example, one of the first pixel PX1, the second pixel PX2, and the third pixel PX3 may display red, another thereof may display green, and the other thereof may display blue. For example, the first pixel PX1 may display red, the second pixel PX2 may display green, and the third pixel PX3 may display blue. An area of the third pixel PX3 may be wider than areas of the first pixel PX1 and/or the second pixel PX2. However, the disclosure is not limited thereto. The first pixel PX1, the second pixel PX2, and the third pixel PX3 may display a same color, and the area of the first pixel PX1, the second pixel PX2, and the third pixel PX3 may be substantially the same.

The first pixel PX1, the second pixel PX2, and the third pixel PX3 may be disposed to be evenly distributed. For example, the first pixel PX1 and the second pixel PX2 may be alternately and repeatedly disposed along the first direction (x). The first and second pixels PX1 and PX2 and the third pixel PX3 may be alternately and repeatedly disposed along the second direction (y). The arrangement of the pixels PX1, PX2, and PX3 may be variously changed.

Each of the pixels PX1, PX2, and PX3 may include a pixel electrode E1. The pixel electrode E1 may include a first electrode portion E1a and a second electrode portion E1b. The first electrode portion E1a and the second electrode portion E1b may be separated from each other. Each of the pixels PX1, PX2, and PX3 may include a connection portion E1c connected to the first electrode portion E1a and the second electrode portion E1b. The connection portion E1c may be positioned between the first electrode portion E1a and the second electrode portion E1b to electrically connect the first electrode portion E1a and the second electrode portion E1b. The connection portion E1c may be positioned at one side of the pixel electrode E1 or at both sides thereof. The position of the connection portion E1c may be variously changed.

Referring to FIG. 8, FIG. 9, and FIG. 10, the display panel 10 may include a substrate SB and layers and elements positioned on the substrate SB.

The substrate SB may be a flexible substrate including a polymer resin such as polyimide, polyamide, polyethylene terephthalate, or a combination thereof. The substrate SB may be multi-layered, and for example, may have a structure in which a base layer including a polymer resin and a barrier layer, which is an inorganic layer, are alternately stacked each other. The substrate SB may be a glass substrate.

A buffer layer BF may be positioned on the substrate SB. The buffer layer BF may block impurities from the substrate SB in case that a semiconductor layer is formed, thereby improving characteristics of the semiconductor layer, and flattening a surface of the substrate SB to reduce stress on the semiconductor layer. The buffer layer BF may include an inorganic insulating material such as a silicon nitride ($SiN_x$), a silicon oxide ($SiO_x$), or a silicon oxynitride ($SiO_xN_y$), and may be a single layer or a multilayer. The buffer layer BF may include amorphous silicon (a-Si).

A semiconductor layer AL may be positioned on the buffer layer BF. The semiconductor layer AL may be referred to as an active layer. The semiconductor layer AL may include a first region, a second region, and a channel region between the first region and the second region. The semiconductor layer AL may include at least one of amorphous silicon, polysilicon, and an oxide semiconductor. For example, the semiconductor layer AL may include a low temperature polycrystalline silicon (LTPS) or an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be disposed on the semiconductor layer AL. The first gate insulating layer GI1 may include an inorganic insulating material such as a silicon nitride, a silicon oxide, or a silicon oxynitride, and may be a single layer or a multilayer. The first gate insulating layer GI1 may be referred to as a first inorganic insulating layer.

A first gate conductive layer that may include a gate electrode GE, a first electrode C1, and the like may be positioned on the first gate insulating layer GI1. The first gate conductive layer may include at least one of the scan line GL1, the initialization control line GL2, the light emitting control line GL3, and the bypass control line GL4. Constituent elements included in the first gate conductive layer may be formed of a same material in a same process. For example, the gate electrode GE, the first electrode C1, and the like may be formed by depositing and patterning a conductive layer on the first gate insulating layer GI1. The gate electrode GE may overlap the channel region of the semiconductor layer AL. A transistor may be configured together with the gate electrode GE and the semiconductor layer AL. The first gate conductive layer may include a metal such as molybdenum (Mo), aluminum (Al), copper (Cu), titanium (T1), and the like, and may be a single layer or a multilayer.

A second gate insulating layer GI2 may be positioned on the first gate conductive layer. The second gate insulating layer GI2 may include an inorganic insulating material such as a silicon nitride, a silicon oxide, or a silicon oxynitride, and may be a single layer or a multilayer. The second gate insulating layer GI2 may be referred to as a second inorganic insulating layer.

A second gate conductive layer that may include a second electrode C2, an upper electrode AE, the repair line RL, and the like may be positioned on the second gate insulating layer GI2. Constituent elements included in the second gate conductive layer may be formed of a same material in a same process. The second electrode C2 may overlap the first electrode C1 to form the storage capacitor $C_{ST}$. The second electrode C2 and the upper electrode AE may be different portions of one conductive pattern. The second electrode C2 and the upper electrode AE may be electrically connected. The second gate conductive layer may include a metal such as molybdenum (Mo), aluminum (Al), copper (Cu), titanium (Ti), and the like, and may be a single layer or a multilayer.

An interlayer insulating layer ILD may be positioned on the second gate insulating layer GI2 and the second gate conductive layer. The interlayer insulating layer ILD may include an inorganic insulating material such as a silicon nitride, a silicon oxide, or a silicon oxynitride, and may be a single layer or a multilayer. The interlayer insulating layer ILD may be referred to as a third inorganic insulating layer.

A data conductive layer that may include a first electrode SE, a second electrode DE, a connection electrode CE, and the like may be positioned on the interlayer insulating layer ILD. The data conductive layer may further include at least one of the data line DL, the driving voltage line PL, and the initialization voltage line IVL. The constituent elements included in the data conductive layer may be formed of a same material in a same process, and may form a same layer. The first electrode SE and the second electrode DE may be respectively connected to the first region and the second region of the semiconductor layer AL through contact holes formed in the insulating layers GI1, GI2, and ILD. One of the first electrode SE and the second electrode DE may be a source electrode, and the other thereof may be a drain electrode. The transistor may include the first electrode SE and/or the second electrode DE together with the gate electrode GE and the semiconductor layer AL. The connection electrode CE may overlap the repair line RL in a third direction intersecting the first direction and the second direction. The connection electrode CE may have a greater width than the repair line RL. For example, a width of the connection electrode CE may be greater than a width of the repair line RL. The width of the connection electrode and the repair line may be measured in the second direction. Accordingly, the connection electrode CE and the repair line RL may be laser-welded at multiple points.

The data conductive layer may include a metal such as aluminum (Al), copper (Cu), silver (Ag), titanium (Ti), molybdenum (Mo), tungsten (W), or tantalum (Ta), and may be a single layer or a multilayer. For example, the data conductive layer may be a double layer such as a titanium layer-copper layer or a titanium layer-aluminum layer. For example, the data conductive layer may be a triple layer such as a titanium layer-aluminum layer-titanium layer.

An organic insulating layer VIA may be positioned on the data conductive layer. The organic insulating layer VIA may include an organic insulating material such as a general purpose polymer such as poly(methyl methacrylate) and polystyrene, a polymer derivative having a phenol-based group, an acryl-based polymer, an imide-based polymer, polyimide, or a siloxane-based polymer. The organic insulating layer VIA may also be referred to as a planarization layer.

A pixel conductive layer that may include the pixel electrode E1 and the connection portion E1c may be positioned on the organic insulating layer VIA. The pixel electrode E1 may be an anode of the light emitting element LD configuring each of the pixels PX1, PX2, and PX3. The pixel electrode E1 may include the first electrode portion E1a and the second electrode portion E1b that are separated from each other. The connection portion E1c may electrically connect the first electrode portion E1a and the second electrode portion E1b. The first electrode portion E1a may be connected to the second electrode DE of the transistor through a first contact hole Ha formed in the organic insulating layer VIA. The first electrode portion E1a may be applied with the driving current $I_D$ that controls brightness of the light emitting element LD. The transistor to which the first electrode portion E1a is connected may be the light emitting control transistor T6 connected to the driving transistor T1. The second electrode portion E1b may be connected to the connection electrode CE through a second contact hole Hb formed in the organic insulating layer VIA. The first electrode portion E1a, the second electrode portion E1b, and the connection portion E1c may be integral with each other. The connection portion E1c, the first electrode portion E1a, and the second electrode portion E1b may be formed of a same material in a same process. The pixel conductive layer may be made of a reflective conductive material or a semi-transmissive conductive material, or may be made of a transparent conductive material. The pixel conductive layer may include a transparent conductive material such as indium tin oxide (ITO) or indium zinc oxide (IZO). The pixel conductive layer may include a metal such as lithium (Li), calcium (Ca), aluminum (Al), silver (Ag), magnesium (Mg), or gold (Au). The pixel conductive layer may be multi-layered, and may have, for example, a triple-layered structure such as an ITO layer-a silver (Ag) layer-a ITO layer.

As the pixel electrode E1 is divided into the first electrode portion E1a and the second electrode portion E1b, an opening OP passing through the pixel electrode E1 in a thickness direction (corresponding to a third direction (z)) may be formed between the first electrode portion E1a and the second electrode portion E1b of the pixel electrode E1. The opening OP may have a slit shape. The opening OP may discharge gas generated by the organic insulating layer VIA. The organic insulating layer VIA may be formed by coating and curing an organic insulating material including an organic solvent, an initiator, and a binder. After forming the organic insulating layer VIA, in a subsequent process and/or during use of the display device, the material remaining in the organic insulating layer VIA or the decomposed material may be discharged as a gas. This phenomenon is called outgassing. For example, after the display panel is manufactured, the discharged gas may propagate to the pixels PX1, PX2, and PX3 to transform or degrade the light emitting layers EL and/or common electrodes E2 of the pixels PX1, PX2, and PX3, and may cause shrinkage or decreasing the light emitting areas of the pixels PX1, PX2, and PX3. By forming the opening OP in the pixel electrode E1, for example, by separating the pixel electrode E1 into the first electrode portion E1a and the second electrode portion E1b, it is possible to smoothly discharge gas through the opening OP, and it is possible to suppress the shrinkage.

A pixel defining layer PDL may be positioned on the organic insulating layer VIA and the pixel electrode E1. The pixel defining layer PDL may have a first opening OPa overlapping the first electrode portion E1a and a second opening OPb overlapping the second electrode portion E1b in the third direction. The first opening OPa and the first light emitting portion LDa may have substantially a same planar shape, and the second opening OPb and the second light emitting portion LDb may have substantially a same planar shape. The first opening OPa and the second opening OPb may be separated from each other. The pixel defining layer PDL may cover an edge of each of the first electrode portion E1a and the second electrode portion E1b. The pixel defining layer PDL may cover the connection portion E1c. The pixel defining layer PDL may include an organic insulating material such as a general purpose polymer such as poly (methyl methacrylate) and polystyrene, a polymer derivative having a phenol-based group, an acryl-based polymer, an imide-based polymer, or a siloxane-based polymer.

A light emitting layer EL may be positioned on the pixel electrode E1. Each of the pixels PX1, PX2, and PX3 may include the light emitting layer EL. The light emitting layer EL may include a first portion ELa corresponding to the first electrode portion E1a and a second portion ELb corresponding to the second electrode portion E1b. The first portion ELa may correspond to the first light emitting portion LDa, and the second portion ELb may correspond to the second light emitting portion LDb. The first portion ELa may overlap the first electrode portion E1a in the third direction, and the second portion ELb may overlap the second electrode portion E1b in the third direction. The first portion ELa may be positioned in the first opening OPa of the pixel defining layer PDL, and the second portion ELb may be positioned in the second opening OPb of the pixel defining layer PDL. The first portion E1a and the first light emitting portion LDa may have substantially a same planar shape, and the second portion ELb and the second light emitting portion LDb may have substantially a same planar shape.

The first portion ELa and the second portion ELb may be separated from each other. Although the light emitting layer EL is separated into the first portion ELa and the second portion ELb, the first portion ELa and the second portion ELb may be positioned on one pixel electrode E1 with which the same driving current $I_D$ based on the same data voltage is applied, so that they may emit light with substantially the same brightness per unit area.

A common electrode E2 may be positioned on the pixel defining layer PDL and the light emitting layer EL. The common electrode E2 may be a cathode of the light emitting element LD (light emitting diode LED). In each of the pixels PX1, PX2, and PX3, the pixel electrode E1, the light emitting layer EL, and the common electrode E2 overlapping each other may configure the light emitting element LD that may be a light emitting diode (LED). The first electrode portion E1a, the first portion ELa, and the common electrode E2 overlapping each other may configure the first light emitting portion LDa, and the second electrode portion E1b, the second portion ELb, and the common electrode E2 overlapping each other may configure the second light emitting portion LDb.

A capping layer (not shown) may be positioned on the common electrode E2, and an encapsulation layer (not shown) may be positioned on the capping layer.

Figure 11:
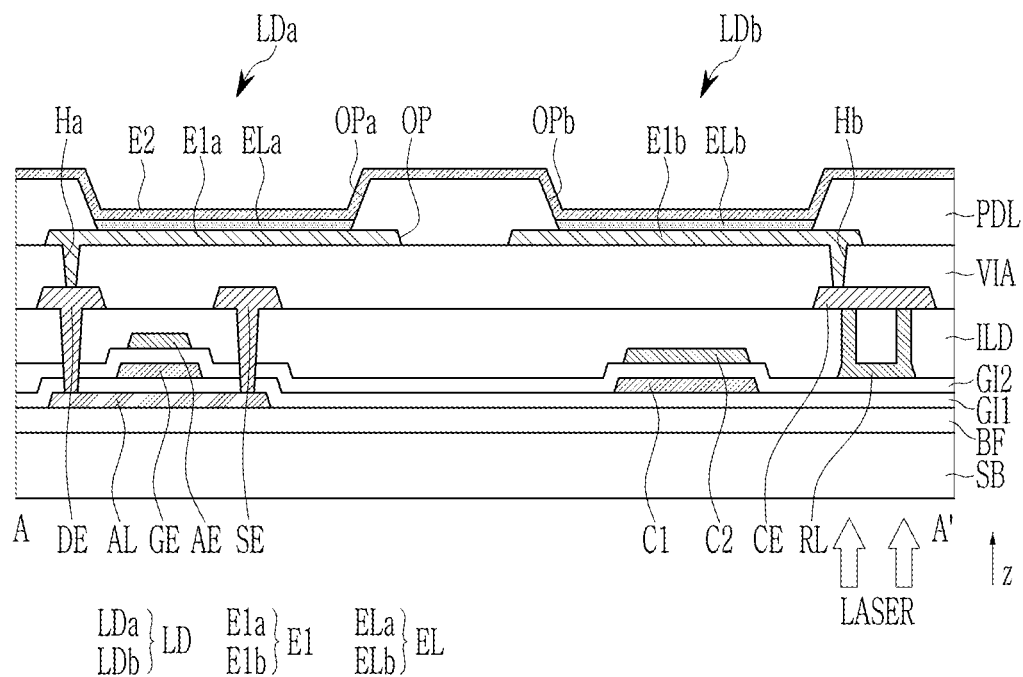
FIG. 11 and FIG. 12 illustrate schematic cross-sectional views for explaining repair of a pixel.
Figure 12:
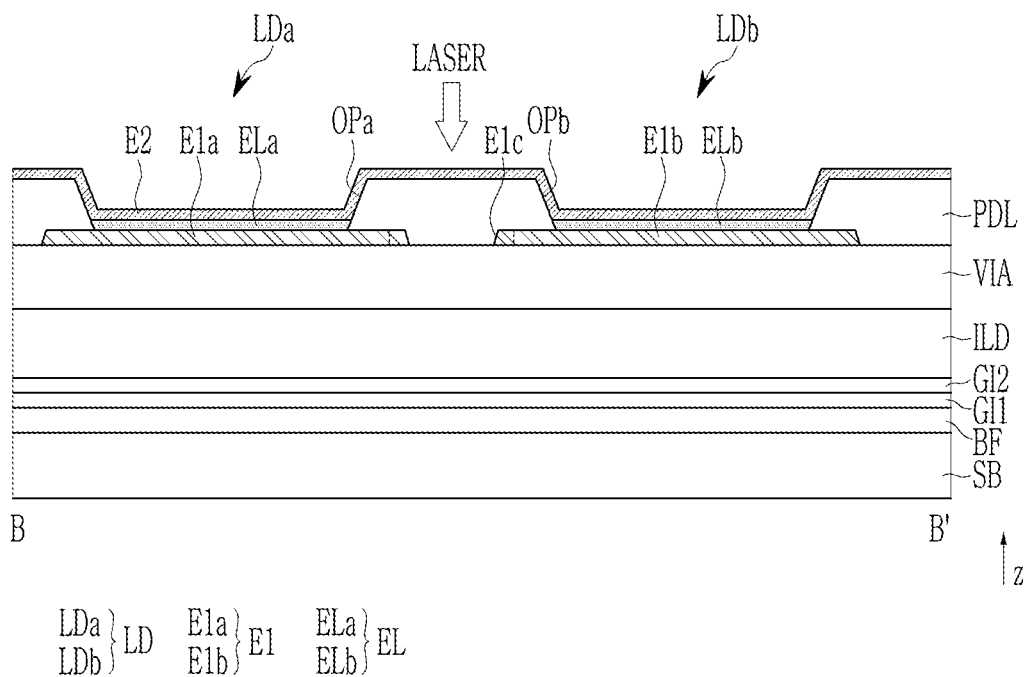

FIG. 11 and FIG. 12 illustrate schematic cross-sectional views for explaining repair of a pixel. FIG. 11 and FIG. 12 may correspond to FIG. 9 and FIG. 10, respectively.

Referring to FIG. 11 and FIG. 12, in case that a defect occurs due to a short circuit between the first electrode portion E1a and the common electrode E2 in the first light emitting portion LDa, the second light emitting portion LDb may be darkened. Since the second electrode portion E1b of the second light emitting portion LDb is electrically connected to the first electrode portion E1a by the connection portion E1c, in case that the first light emitting portion LDa is short-circuited, the second light emitting portion LDb may be also short-circuited, so that the second light emitting portion LDb may be darkened. In order to prevent the second light emitting portion LDb from being darkened, as shown in FIG. 12, the first electrode portion E1a and the second electrode portion E1b may be electrically separated by cutting the connection portion E1c by irradiating a laser beam to the connection portion E1c. As shown in FIG. 11, the repair line RL and the connection electrode CE may be laser-welded by irradiating a laser beam to the connection electrode CE. The interlayer insulating layer ILD positioned between the repair line RL and the connection electrode CE may be broken by the laser-welding, and the connection electrode CE and the repair line RL may be physically and electrically connected. Since the second electrode portion E1b is electrically connected to the connection electrode CE, the second electrode portion E1b may be electrically connected to the repair line RL. Accordingly, the second electrode portion E1b may receive the driving current $I_{D'}$ that may be transmitted through the repair line RL, and may normally emit light with a brightness corresponding to the intensity of the driving current $I_{D'}$. Since the connection electrode CE has a greater width than the repair line RL, they may be laser-welded at multiple points, for example, at two points as shown. Accordingly, a short circuit repair rate between the repair line RL and the connection electrode CE may increase.

In case that a defect occurs in the second light emitting portion LDb, the first electrode portion E1a and the second electrode portion E1b may be electrically separated by cutting the connection portion E1c as shown in FIG. 12. Accordingly, the second electrode portion E1b may be in an electrically floating state, and the first light emitting portion LDa may normally emit light.

As described above, in case that a defect occurs in the first light emitting portion LDa or the second light emitting portion LDb, by cutting the connection portion E1c connecting the first electrode portion E1a and the second electrode portion E1b, it is possible to prevent other light emitting portions from becoming defective due to the defective light emitting portion. In case that a defect occurs in the first light emitting portion LDa connected to the pixel circuit PC, it is possible to normally operate the second light emitting portion LDb by electrically connecting the second electrode portion E1b to the repair line RL. Among the first light emitting portion LDa and the second light emitting portion LDb, a light emitting portion in which a defect does not occur may be readily repaired, and it is possible to prevent the pixel PX from being darkened. For ease of cutting of the connection portion E1c, a length of the connection portion E1c may be greater than or equal to about 4.5 μm. The length of the connection portion E1c may be measured in the first direction.

Although an embodiment in which the repair line RL is included in the second gate conductive layer has been described, the repair line RL may be disposed in other conductive layers such as the first gate conductive layer, the data conductive layer, the pixel conductive layer, and the semiconductor layer. For example, the repair line RL may be disposed in the first gate conductive layer including the gate electrode GE, and the insulating layers ILD and GI2 between the connection electrode CE and the repair line RL during laser-welding may be destroyed, so that the repair line RL may be connected to the connection electrode CE. Although an embodiment in which each of the pixels PX1, PX2, and PX3 includes the first light emitting portion LDa and the second light emitting portion LDb separated from each other has been described, light emitting portions may be included in some of the pixels (for example, the third pixel PX3 having a large area).

Figure 13:
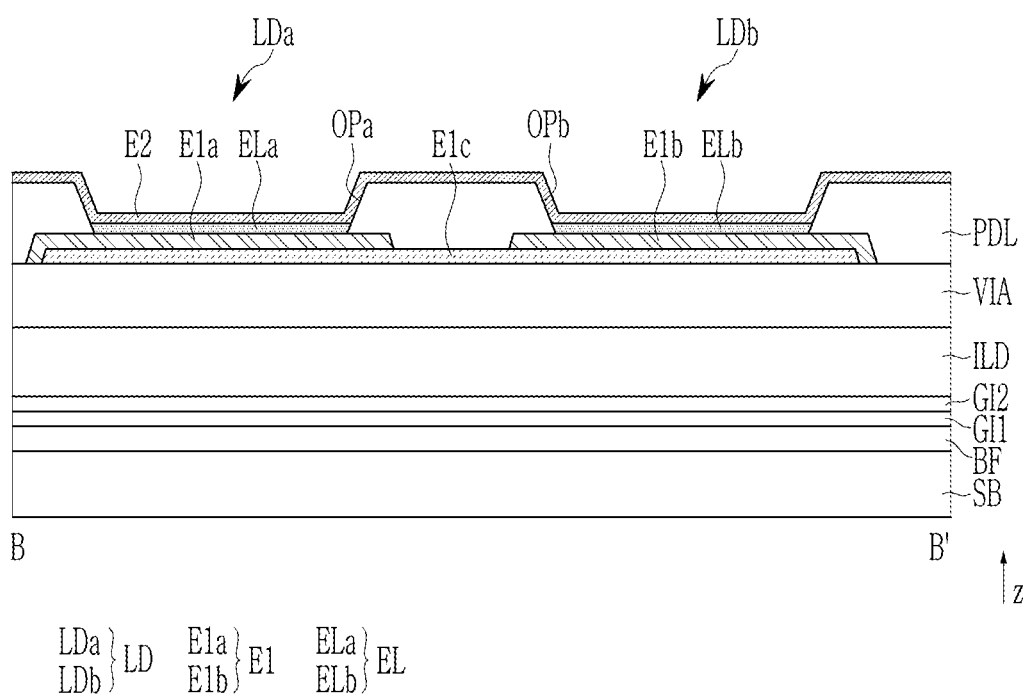
FIG. 13 illustrates a schematic cross-sectional view of an embodiment taken along line B-B' of FIG. 8.
Figure 14:
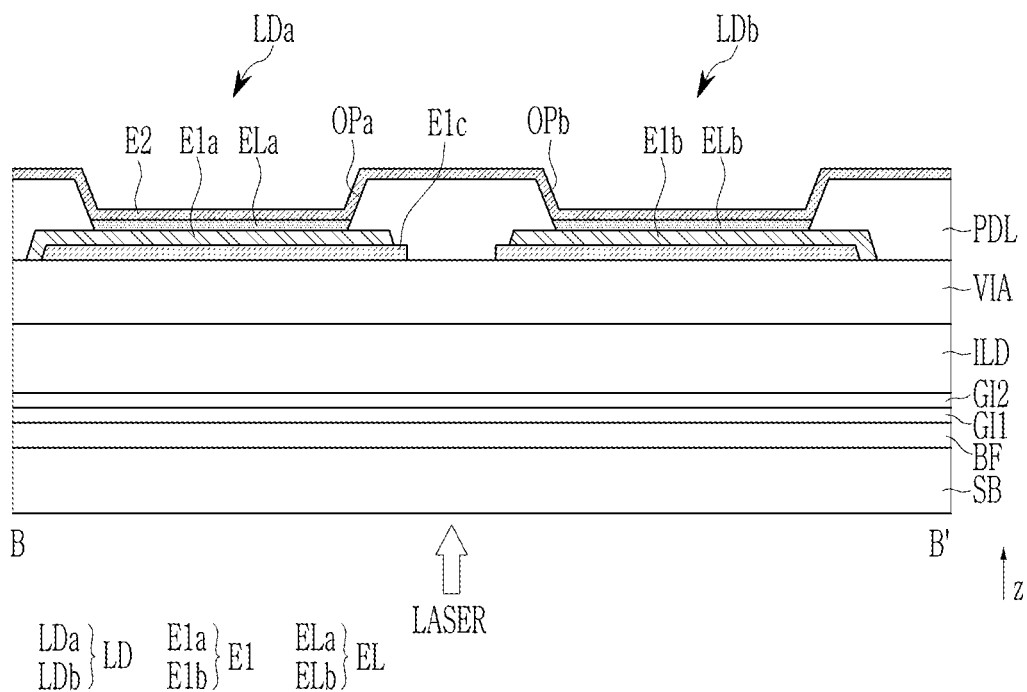
FIG. 14 illustrates a schematic cross-sectional view for explaining repair of a pixel.

FIG. 13 illustrates a schematic cross-sectional view of an embodiment taken along line B-B' of FIG. 8, and FIG. 14 illustrates a schematic cross-sectional view for explaining repair of a pixel.

Referring to FIG. 13, there is a difference in the configuration of the pixel electrode E1 and the connection portion E1c from the light emitting display device illustrated in FIG. 10. For example, the pixel electrode E1 may include the first electrode portion E1a and the second electrode portion E1b that are separated from each other. The first electrode portion E1a and the second electrode portion E1b may be electrically connected by the connection portion E1c. The connection portion E1c may be positioned between the first and second electrode portions E1a and E1b and the organic insulating layer VIA. An upper surface of the connection portion E1c may contact the first electrode portion E1a and the second electrode portion E1b, and a lower surface of the connection portion E1c may contact the organic insulating layer VIA. To planarize the first electrode portion E1a and the second electrode portion E1b, the connection portion E1c may be formed to overlap the first electrode portion E1a and the second electrode portion E1b. The connection portion E1c may be a conductive layer including a metal such as titanium (Ti), tantalum (Ta), tungsten (W), or chromium (Cr). For example, the connection portion E1c may be a titanium layer. In case that the connection portion E1c is formed of a conductive layer different from that of the pixel electrode E1, it may be made of a material that absorbs laser energy better than the material of the pixel electrode E1 or is readily cut by laser, so that it is possible to further readily cut the connection portion E1c. As shown in FIG. 14, the connection portion E1c may be cut by irradiating a laser beam in the display panel 10, and the first electrode portion E1a and the second electrode portion E1b may be electrically separated.

Figure 15:
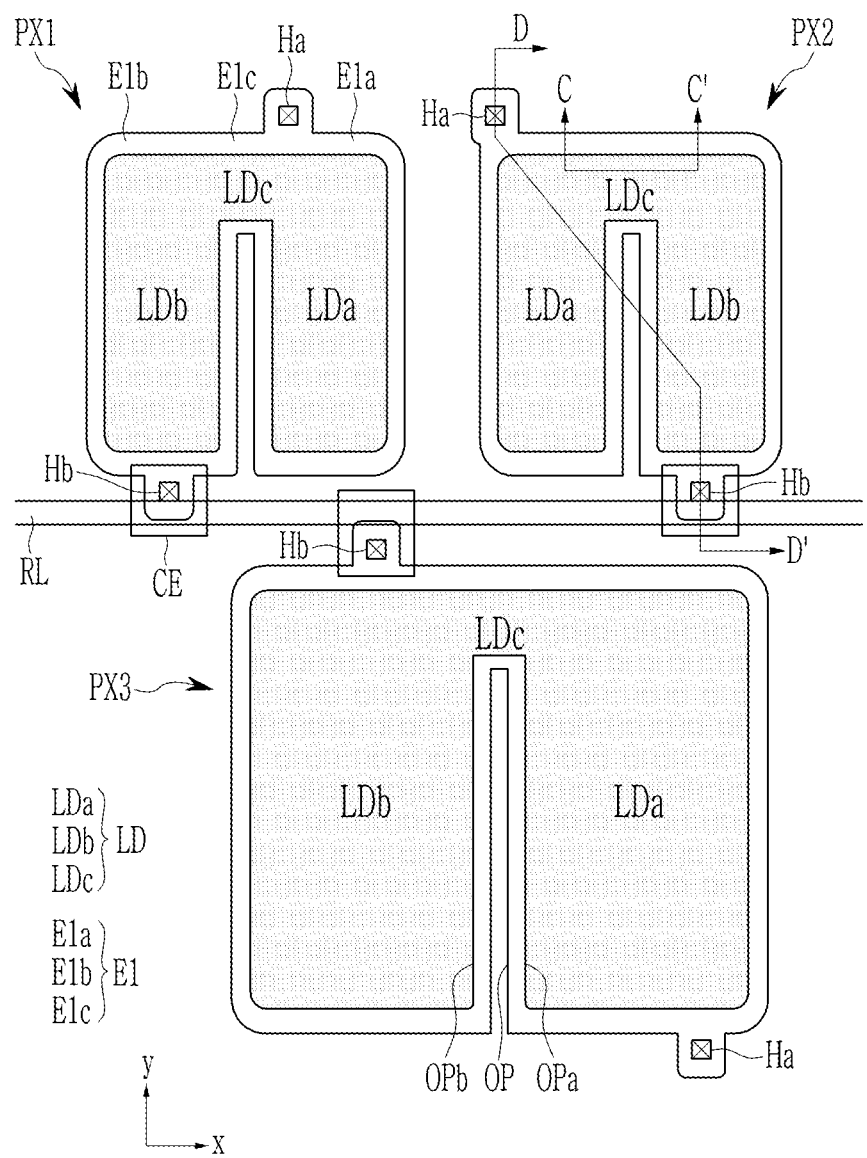
FIG. 15 illustrates a schematic top plan view of pixels disposed in a display area in a light emitting display device according to an embodiment.
Figure 16:
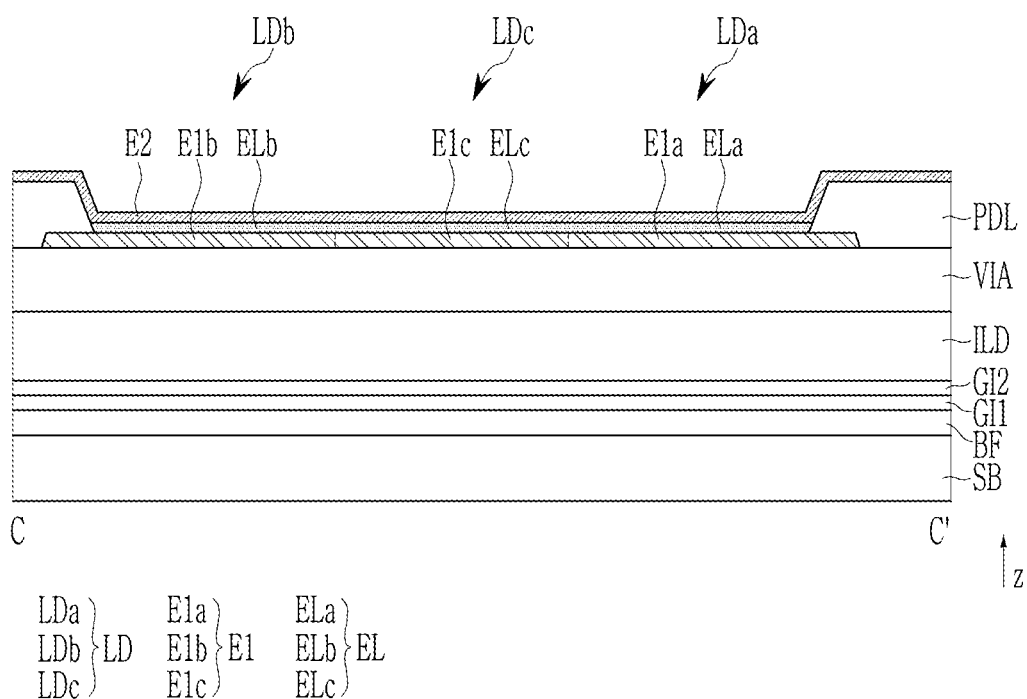
FIG. 16 illustrates a schematic cross-sectional view of an embodiment taken along line C-C' of FIG. 15.
Figure 17:
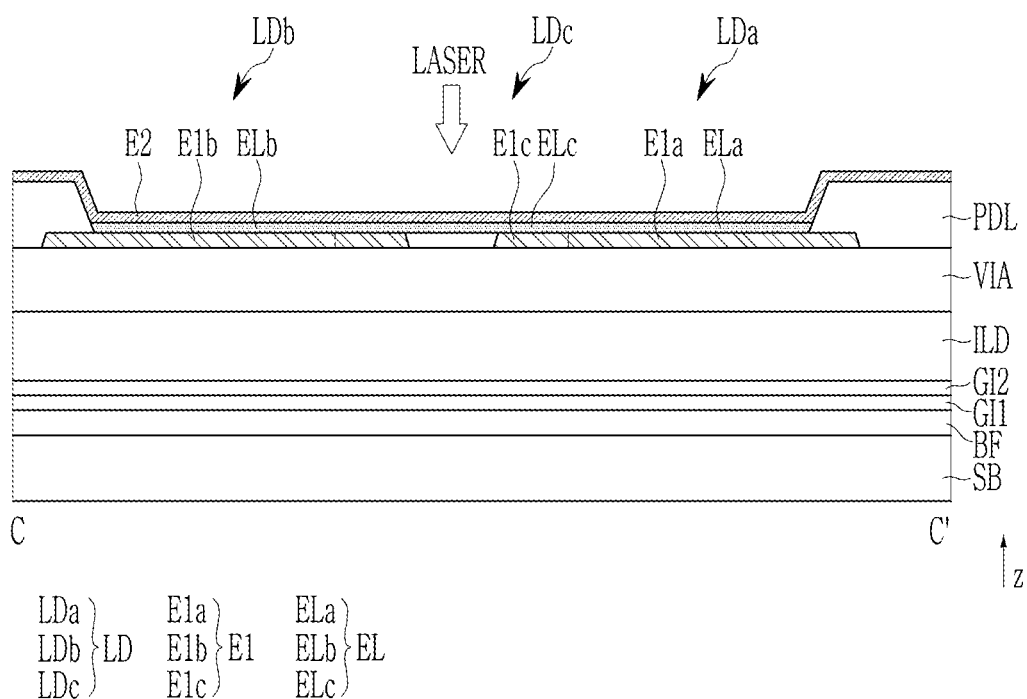
FIG. 17 and FIG. 18 illustrate schematic cross-sectional views for explaining repair of a pixel.
Figure 18:
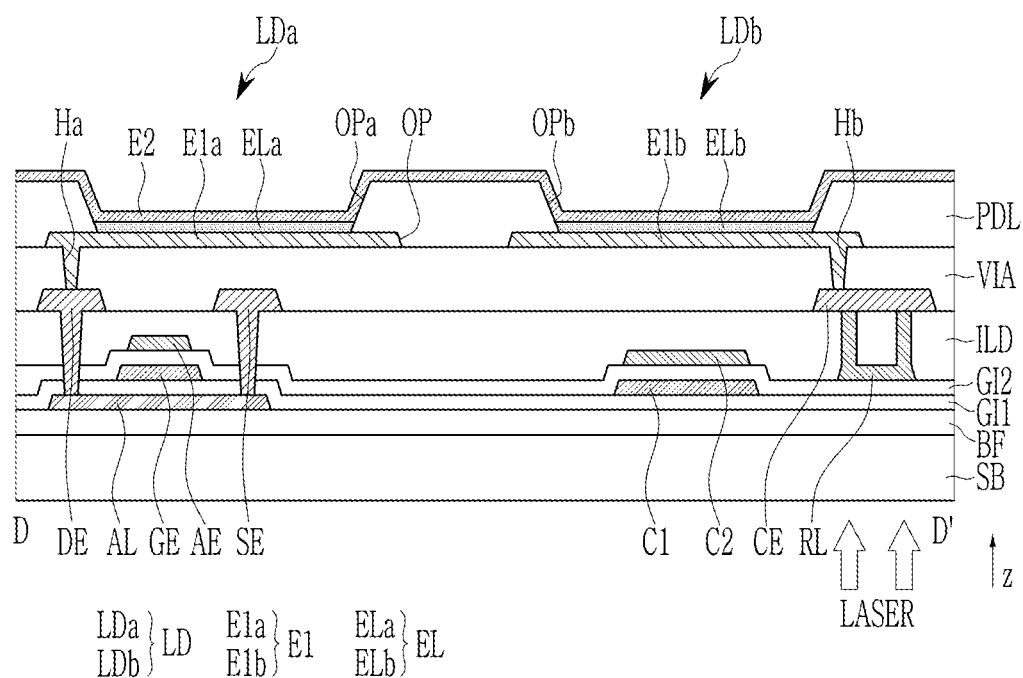

FIG. 15 illustrates a schematic top plan view of pixels disposed in a display area in a light emitting display device according to an embodiment, and FIG. 16 illustrates a schematic cross-sectional view of an embodiment taken along line C-C' of FIG. 15. FIG. 17 and FIG. 18 illustrate schematic cross-sectional views for explaining repair of a pixel.

Referring to FIG. 15 and FIG. 16, the light emitting element LD of each of the pixels PX1, PX2, and PX3 may include the first light emitting portion LDa, the second light emitting portion LDb, and the third light emitting portion LDc. The third light emitting portion LDc may be positioned between the first light emitting portion LDa and the second light emitting portion LDb to connect the first light emitting portion LDa and the second light emitting portion LDb. The first light emitting portion LDa, the second light emitting portion LDb, and the third light emitting portion LDc may substantially form a "H"-shaped light emitting area.

The pixel electrode E1 may include the first electrode portion E1a, the second electrode portion E1b, and the connection portion E1c. The first electrode portion E1a, the second electrode portion E1b, and the connection portion E1c may be integral with each other. The light emitting layer EL may include a first portion ELa positioned on the first electrode portion E1a, a second portion ELb positioned on the second electrode portion E1b, and a third portion ELc positioned on the connection portion E1c. The first portion ELa, the second portion ELb, and the third portion ELc may be integral with each other. Unlike the above-described embodiments, the connection portion E1c may be included in the pixel electrode E1 as a third electrode portion, and the light emitting layer EL may be also positioned on the connection portion E1c, so that an area in which the connection portion E1c is positioned may be the third light emitting portion LDc.

Even in such a pixel structure, in case that a defect occurs in the first light emitting portion LDa or the second light emitting portion LDb, as shown in FIG. 17, by irradiating a laser beam to the connection portion E1c to cut the connection portion E1c, the first electrode portion E1a and the second electrode portion E1b may be electrically separated, and it is possible to prevent other light emitting portions from becoming defective together due to the defective light emitting portion. In case that a defect occurs in the first light emitting portion LDa connected to the pixel circuit PC, as shown in FIG. 18, it is possible to normally operate the second light emitting portion LDb by electrically connecting the second electrode portion E1b to the repair line RL. Among the first light emitting portion LDa and the second light emitting portion LDb, a light emitting portion in which a defect does not occur may be readily repaired, and it is possible to prevent the entire pixel PX from being darkened.

Figure 19:
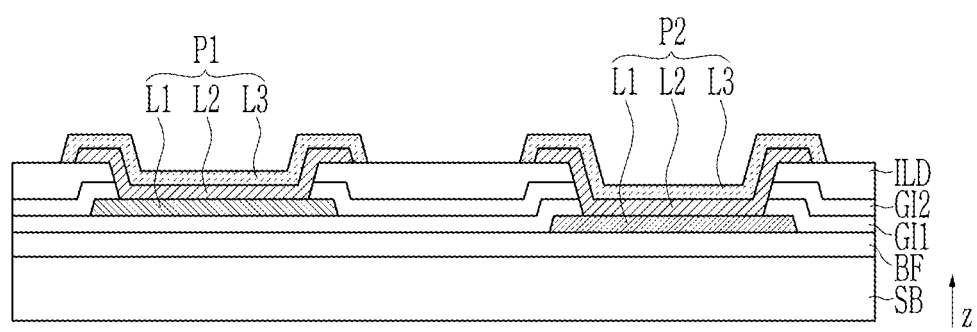
FIG. 19 illustrates a schematic cross-sectional view of a pad portion of a light emitting display device according to an embodiment.
Figure 20:
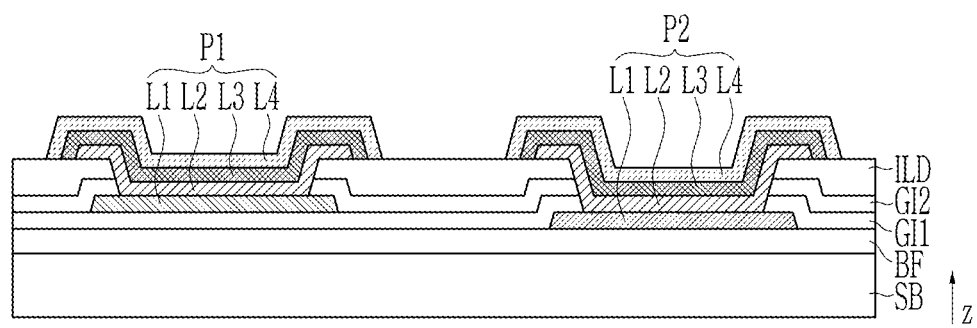
FIG. 20 illustrates a schematic cross-sectional view of a pad portion of a light emitting display device according to an embodiment.

FIG. 19 and FIG. 20 respectively illustrate a schematic cross-sectional view of a pad portion of a light emitting display device according to an embodiment.

Referring to FIG. 19, a cross-sectional structure of a first pad P1 and a second pad P2 adjacent to each other among pads positioned on the pad portion PP of the display panel 10 is shown. Each of the pads P1 and P2 may include a first electrode layer L1, a second electrode layer L2, and a third electrode layer L3 positioned on the substrate SB. The third electrode layer L3 may be an uppermost layer of each of the pads P1 and P2.

The first electrode layer L1 of the first pad P1 may be included in the first gate conductive layer, and the first electrode layer L1 of the second pad P2 may be included in the second gate conductive layer. However, the disclosure is not limited thereto, and the first electrode layer L1 of the first pad P1 and the first electrode layer L1 of the second pad P2 may be both included in the first gate conductive layer or included in the second gate conductive layer. The first electrode layer L1 may be connected to a signal line such as a data line and a wire for electrical connection of the pads P1 and P2, or may be an extension of such a wire. An edge of the first electrode layer L1 may be clad by the first gate insulating layer GI1, the second gate insulating layer GI2, and the interlayer insulating layer ILD, or by the second gate insulating layer GI2 and the interlayer insulating layer ILD.

The second electrode layer L2 of the first pad P1 may contact the first electrode layer L1 through a contact hole formed in the second gate insulating layer GI2 and the interlayer insulating layer ILD. The second electrode layer L2 of the second pad P2 may contact the first electrode layer L1 through a contact hole formed in the first gate insulating layer GI1, the second gate insulating layer GI2, and the interlayer insulating layer ILD. The second electrode layer L2 may be included in the data conductive layer.

The third electrode layer L3 of each of the pads P1 and P2 may be positioned on the second electrode layer L2. The third electrode layer L3 may be a capping layer completely covering the second electrode layer L2. The third electrode layer L3 may include a corrosion-resistant metal such as titanium (Ti), tantalum (Ta), tungsten (W), or chromium (Cr). The third electrode layer L3 may prevent the second electrode layer L2 from being damaged in an etching process for forming the pixel electrode E1 after forming the data conductive layer including the second electrode layer L2. It is also possible to prevent or improve a precipitate of silver (Ag) particles on the second electrode layer L2 due to a galvanic effect between a silver ion (AO generated in an etchant and the second electrode layer L2. The third electrode layer L3 and the connection portion E1c of the embodiment shown in FIG. 10 may be formed of a same material in a same process. An additional process step for forming the third electrode layer L3 or use of a mask therefor may not be required.

Referring to FIG. 20, each of the pads P1 and P2 may include a first electrode layer L1, a second electrode layer L2, a third electrode layer L3, and a fourth electrode layer L4. The fourth electrode layer L4 may be an uppermost layer of each of the pads P1 and P2. The configuration of the first electrode layer L1 and the second electrode layer L2 may be substantially the same as that of the embodiment shown in FIG. 19.

The third electrode layer L3 may cover the second electrode layer L2. The third electrode layer L3 may include a metal such as aluminum (Al), copper (Cu), silver (Ag), titanium (Ti), molybdenum (Mo), tungsten (W), or tantalum (Ta), and may be a single layer or a multilayer. At least one of the signal lines GL1, GL2, GL3, GL4, DL, PL, and IVL in the display area DA may be formed of a same material as the third electrode layer L3 in a same process, and it may be positioned between the organic insulating layer VIA and the pixel electrode E1.

The fourth electrode layer L4 may be a capping layer completely covering the third electrode layer L3. The fourth electrode layer L4 may include a corrosion-resistant metal such as titanium (Ti), tantalum (Ta), tungsten (W), or chromium (Cr). The fourth electrode layer L4 may prevent the third electrode layer L3 from being damaged in an etching process for forming the pixel electrode E1 after forming the data conductive layer including the third electrode layer L3, and it may prevent or improve precipitation of silver (Ag) particles on the third electrode layer L3. The fourth electrode layer L4 and the connection portion E1c according to the embodiment shown in FIG. 10 may be formed of ae same material in a same process.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting display device, comprising:
   a pixel circuit disposed on a substrate;
   a repair line disposed on the substrate;
   a connection electrode overlapping the repair line in a thickness direction of the substrate;
   an insulating layer disposed on the pixel circuit and the connection electrode;
   a pixel electrode disposed on the insulating layer; and
   a connection portion disposed on the insulating layer, wherein
   the pixel electrode includes:
   a first electrode portion electrically connected to the pixel circuit through a first contact hole formed in the insulating layer; and
   a second electrode portion electrically connected to the connection electrode directly through a second contact hole formed in the insulating layer, and
   the connection portion electrically connects the first electrode portion and the second electrode portion.

2. The light emitting display device of claim 1, wherein a width of the connection electrode is greater than a width of the repair line.

3. The light emitting display device of claim 1, further comprising
   a pixel defining layer disposed on the insulating layer and including a first opening and a second opening respectively overlapping the first electrode portion and the second electrode portion in the thickness direction,
   wherein the pixel defining layer covers the connection portion.

4. The light emitting display device of claim 1, further comprising
   a light emitting layer including a first portion and a second portion that are respectively disposed on the first electrode portion and the second electrode portion and are separated from each other.

5. The light emitting display device of claim 1, wherein
   the pixel circuit includes a transistor,
   the first electrode portion is electrically connected to an electrode of the transistor, and
   the connection electrode and the electrode of the transistor are formed of a same material in a same process.

6. The light emitting display device of claim 1, wherein
   the pixel circuit includes a capacitor, and
   the repair line and an electrode of the capacitor are formed of a same material in a same process.

7. The light emitting display device of claim 1, wherein
   the pixel electrode has an opening passing through the pixel electrode in the thickness direction and disposed between the first electrode portion and the second electrode portion.

8. The light emitting display device of claim 1, further comprising:
   a dummy pixel circuit disposed on the substrate and electrically connected to the repair line, wherein
   the substrate includes a display area displaying an image and a non-display area disposed adjacent to the display area,
   the pixel circuit is disposed in the display area, and
   the dummy pixel circuit is disposed in the non-display area.

9. The light emitting display device of claim 1, further comprising:
   a data line electrically connected to the pixel circuit and transmitting a data voltage; and
   a gate line electrically connected to the pixel circuit and transmitting a gate signal, wherein
   the repair line and the data line extend in a same direction, or
   the repair line and the gate line extend in a same direction.

10. The light emitting display device of claim 1, wherein
    the connection portion is disposed between the first and second electrode portions and the insulating layer.

11. The light emitting display device of claim 10, wherein the connection portion includes titanium.

12. The light emitting display device of claim 10, further comprising:
    a pad portion including a plurality of pads, wherein
    each of the plurality of pads includes a plurality of electrode layers, and
    an uppermost layer of the plurality of electrode layers and the connection portion are formed of a same material in a same process.

13. The light emitting display device of claim 12, wherein
    the uppermost layer completely covers an electrode layer of the plurality of electrode layers disposed immediately below the uppermost layer.

14. The light emitting display device of claim 1, further comprising:
    a light emitting layer including:
    a first portion disposed on the first electrode portion;
    a second portion disposed on the second electrode portion; and
    a third portion disposed on the connection portion,
    wherein the first portion, the second portion, and the third portion are integral with each other.

15. The light emitting display device of claim 1, wherein a length of the connection portion is greater than or equal to about 4.5 μm.

16. An electronic device, comprising:
    a display device, comprising:
    a pixel circuit and a dummy pixel circuit each disposed on a substrate;
    a repair line electrically connected to the dummy pixel circuit;
    a connection electrode overlapping the repair line in a thickness direction of the substrate and electrically connected to the repair line;

an insulating layer disposed on the pixel circuit and the connection electrode;

a pixel electrode disposed on the insulating layer and including:

a first electrode portion electrically connected to the pixel circuit through a first contact hole formed in the insulating layer; and a second electrode portion electrically connected to the connection electrode directly through a second contact hole formed in the insulating layer; and a light emitting layer including:

a first portion disposed on the first electrode portion; and a second portion disposed on the second electrode portion, wherein the first electrode portion and the second electrode portion are separated from each other.

17. The electronic device of claim 16, further comprising:

a pixel defining layer disposed on the pixel electrode and including a first opening and a second opening respectively overlapping the first electrode portion and the second electrode portion in the thickness direction, wherein the first opening and the second opening are separated from each other.

18. The electronic device of claim 16, wherein the pixel circuit includes a capacitor, and the repair line and an electrode of the capacitor are formed of a same material in a same process.

19. The electronic device of claim 16, further comprising:

an insulating layer disposed between the repair line and the connection electrode, wherein the repair line is laser-welded to the connection electrode through the insulating layer.

20. The electronic device of claim 16, further comprising:

an insulating layer disposed between the connection electrode and the pixel electrode, and a conductive layer disposed between the insulating layer and the first and second electrode portions and contacting the insulating layer, the first electrode portion, and the second electrode portion.

* * * * *